(12) United States Patent
Deruty

(10) Patent No.: US 11,069,369 B2
(45) Date of Patent: Jul. 20, 2021

(54) METHOD AND ELECTRONIC DEVICE

(71) Applicant: Sony Europe B.V., Surrey (GB)

(72) Inventor: Emmanuel Deruty, Stuttgart (DE)

(73) Assignee: Sony Europe B.V., Surrey (GB)

( * ) Notice: Subject to any disclaimer, the term of this patent is extended or adjusted under 35 U.S.C. 154(b) by 0 days.

(21) Appl. No.: 16/646,146

(22) PCT Filed: Sep. 27, 2018

(86) PCT No.: PCT/EP2018/076359
§ 371 (c)(1),
(2) Date: Mar. 11, 2020

(87) PCT Pub. No.: WO2019/063736
PCT Pub. Date: Apr. 4, 2019

(65) Prior Publication Data
US 2020/0273481 A1   Aug. 27, 2020

(30) Foreign Application Priority Data

Sep. 28, 2017   (EP) ..................................... 17193913

(51) Int. Cl.
| | |
|---|---|
| *G10L 25/18* | (2013.01) |
| *G10L 21/0316* | (2013.01) |
| *G10L 25/21* | (2013.01) |
| *G10L 25/30* | (2013.01) |
| *G06N 3/08* | (2006.01) |
| *H03G 5/16* | (2006.01) |
| *G11B 27/28* | (2006.01) |
| *G11B 27/031* | (2006.01) |

(52) U.S. Cl.
CPC .......... *G10L 25/18* (2013.01); *G10L 21/0316* (2013.01); *G10L 25/21* (2013.01); *G10L 25/30* (2013.01)

(58) Field of Classification Search
None
See application file for complete search history.

(56) References Cited

U.S. PATENT DOCUMENTS

| | | | |
|---|---|---|---|
| 8,150,044 B2 * | 4/2012 | Goldstein | ............ H04R 1/1083 381/57 |
| 2012/0063615 A1 | 3/2012 | Crockett et al. | |
| 2012/0323571 A1 | 12/2012 | Song et al. | |
| 2014/0272883 A1 * | 9/2014 | Pardo | ....................... G09B 5/04 434/319 |
| 2016/0035332 A1 * | 2/2016 | Neuhauser | .............. G06F 40/40 700/94 |

(Continued)

FOREIGN PATENT DOCUMENTS

| | | |
|---|---|---|
| WO | 2005/106843 A1 | 11/2005 |
| WO | 2013/106366 A1 | 7/2013 |
| WO | 2015/035492 A1 | 3/2015 |

OTHER PUBLICATIONS

International Search Report and Written Opinion dated Nov. 29, 2018 for PCT/EP2018/076359 filed on Sep. 27, 2018, 12 pages.

(Continued)

*Primary Examiner* — Qin Zhu
(74) *Attorney, Agent, or Firm* — Xsensus LLP

(57) ABSTRACT

A method comprising determining feature values of an input audio window and determining model parameters for the input audio window based on processing of feature values using a neural network.

15 Claims, 13 Drawing Sheets

(56) References Cited

U.S. PATENT DOCUMENTS

| | | | |
|---|---|---|---|
| 2017/0070817 A1* | 3/2017 | Seo | G10L 25/51 |
| 2018/0166067 A1* | 6/2018 | Dimitriadis | G10L 25/78 |
| 2018/0197533 A1* | 7/2018 | Lyon | G10L 15/02 |

OTHER PUBLICATIONS

"Acoustics—Normal equal-loudness-level contours," ISO 226, Aug. 15, 2003, 47 pages (including English Version).
"L2 Ultramaximizer Peak Limiter Plugin | Waves," Retrieved from the Internet URL: http://www.waves.com/plugins/I2-ultramaximizer, on Sep. 15, 2017, 2 pages.
"L2-UltraMaximizer Software audio processor User's Guide," Sep. 2017, 18 pages.
"Phase Correction Plugin—InPhase | Waves," Retrieved from the Internet URL: https://www.waves.com/plugins/inphase, on Oct. 1, 2017, 2 pages.
"Q10—10 Band Paragraphic EQ Plugin | Waves," Retrieved from the Internet URL: https://www.waves.com/plugins/q10-equalizer, on Oct. 5, 2017, 3 pages.
"Reaper | Audio Production Without Limits," Digital Audio Workstation, Retrieved from the Internet URL: http://www.reaper.fm/, on Oct. 12, 2017, 4 pages.
"Waves InPhase User Guide," Jun. 2017, 21 pages.
Aichinger, P., et al., "Describing the transparency of mixdowns: The Masked-to-Unmasked-Ratio," Audio Engineering Society, Convention Paper 8344, Presented at the 130th Convention, London, UK, May 13-16, 2011, pp. 1-10.
Bitzer, J., and Leboeuf, J., "Automatic detection of salient frequencies," Audio Engineering Society, Convention Paper 7704, Presented at the 126th Convention, Munich, Germany, May 7-10, 2009, pp. 1-6.
Dannenberg, R.B., "An Intelligent Multi-Track Audio Editor," In Proceedings of the 2007 International Computer Music Conference, vol. 2, San Francisco, Aug. 2007, pp. 1-7.
Deruty, E., "Goal-Oriented Mixing," Proceedings of the 2nd AES Workshop on Intelligent Music Production, London, UK, Sep. 13, 2016, 2 pages.
Deruty, E., and Tardieu, D., "About Dynamic Processing in Mainstream Music," Journal of the Audio Engineering Society, vol. 62, No. 1/2, Jan./Feb. 2014, pp. 42-55.
Deruty, E., et al., "Human-Made Rock Mixes Feature Tight Relations Between Spectrum and Loudness," Journal of the Audio Engineering Society, vol. 62, No. 10, Oct. 2014, pp. 1-11.
Fletcher, H., and Munson, W.A., "Loudness, Its Definition, Measurement and Calculation," The Journal of the Acoustical Society of America, vol. 5, No. 2, Oct. 1993, pp. 82-108.
Hafezi, S., and Reiss, J.D., "Autonomous Multitrack Equalization Based on Masking Reduction," Journal of the Audio Engineering Society, vol. 63, No. 5, May 2015, pp. 312-323.
John, V., "Multi-Source Room Equalization: Reducing Room Resonances," Audio Engineering Society, Convention Paper 7262, Presented at the 123rd Convention, Oct. 1, 2007, 2 pages (with Abstract only).
Ma, Z., et al., "Intelligent Multitrack Dynamic Range Compression," Journal of the Audio Engineering Society, vol. 63, No. 6, Jun. 2015, pp. 412-426.
Ma, Z., et al., "Partial Loudness in Multitrack Mixing," AES 53rd International Conference, London, UK, Jan. 27-29, 2014, pp. 1-9.
Mansbridge, S., et al., "Implementation and Evaluation of Autonomous Multi-track Fader Control," Audio Engineering Society, Convention Paper 8588, Presented at the 132nd Convention, Budapest, Hungary, Apr. 26-29, 2012, pp. 1-11.
QMUL, "Automatic mixing tools for audio and music production," Center for Digital Music, Retrieved from the Internet URL: http://c4dm.eecs.qmul.ac.uk/automaticmixing/, 1 page.
Ronan, D., et al., "Analysis of the subgrouping practices of professional mix engineers," Audio Engineering Society, Convention Paper, Presented at the 142nd Convention, Berlin, Germany, May 20-23, 2017, pp. 1-13.
Ronan, D., et al., "Automatic Subgrouping of Multitrack Audio," Proc. of the 18th Int. Conference on Digital Audio Effects (DAFx-15), Trondheim, Norway, Nov. 30-Dec. 3, 2015, pp. 1-8.
Stavrou, M., "Mixing with your Mind," 2008, 1 page.
Suzuki, Y., and Takeshima, H., "Equal-loudness-level contours for pure tones," The Journal of the Acoustical Society of America, vol. 116, No. 2, Aug. 2004, pp. 918-933.
Ward, D., and Reiss, J.D., "Loudness Algorithms for Automatic Mixing," Proceedings of the 2nd AES Workshop on Intelligent Music Production, London, UK, Sep. 13, 2016, 2 pages.
Ward, D., et al., "Multi-track mixing using a model of loudness and partial loudness," Audio Engineering Society, Convention Paper 8693, Presented at the 133rd Convention, San Francisco, USA, Oct. 26-29, 2012, pp. 1-9.
Lartillot, O., "MIRtoolbox 1.6.1 User's Manual," Dec. 7, 2014, pp. 1-220.

* cited by examiner

US 11,069,369 B2

METHOD AND ELECTRONIC DEVICE

CROSS-REFERENCE TO RELATED APPLICATIONS

The present application is based on PCT filing PCT/EP2018/076359, filed Sep. 27, 2018, which claims priority to EP 17193913.5, filed Sep. 28, 2017, the entire contents of each are incorporated herein by reference.

TECHNICAL FIELD

The present disclosure generally pertains to the field of audio processing, e.g. in music production.

TECHNICAL BACKGROUND

A digital audio workstation (DAW) is an electronic device or software application for recording, editing and producing audio files such as musical pieces, speech or sound effects. DAWs typically provide a user interface that allows the user to record, edit and mix multiple recordings and tracks into a final produced piece.

Music production involves the processes of recording, mixing and mastering. A computer-based DAW typically allows for multitrack recording of audio and provides controls for playing, recording and editing audio tracks.

Modern computer-based DAWs support software plug-ins, each having its own functionality, which can expand the sound processing capabilities of the DAW. There exist for example software plug-ins for equalization, limiting, and compression. There also exist software plug-ins which provide audio effects such as reverb and echo. And there exist software plug-ins which provide sound sources to a DAW such as virtual instruments and samplers.

In audio production, mastering is a process according to which final audio adjustments are performed before finalization. Mastering may be performed by humans includes the balancing of the perceived spectrum of the content.

There is a general need for providing computer-implemented aid to a user in the process of recording, mixing and mastering.

SUMMARY

According to a first aspect the disclosure provides a method comprising determining feature values of an input audio window and determining model parameters from the input audio window based on the processing of feature values using a neural network.

According to a further aspect the disclosure provides an electronic device comprising circuitry configured to determine feature values of an input audio window and to determine model parameters for the input audio window based on the processing of feature values using a neural network.

According to a further aspect the disclosure provides a computer program comprising instructions, which when executed on a processor cause the processor to determine feature values of an input audio window and to determine model parameters for the input audio window based on processing of feature values using a neural network.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
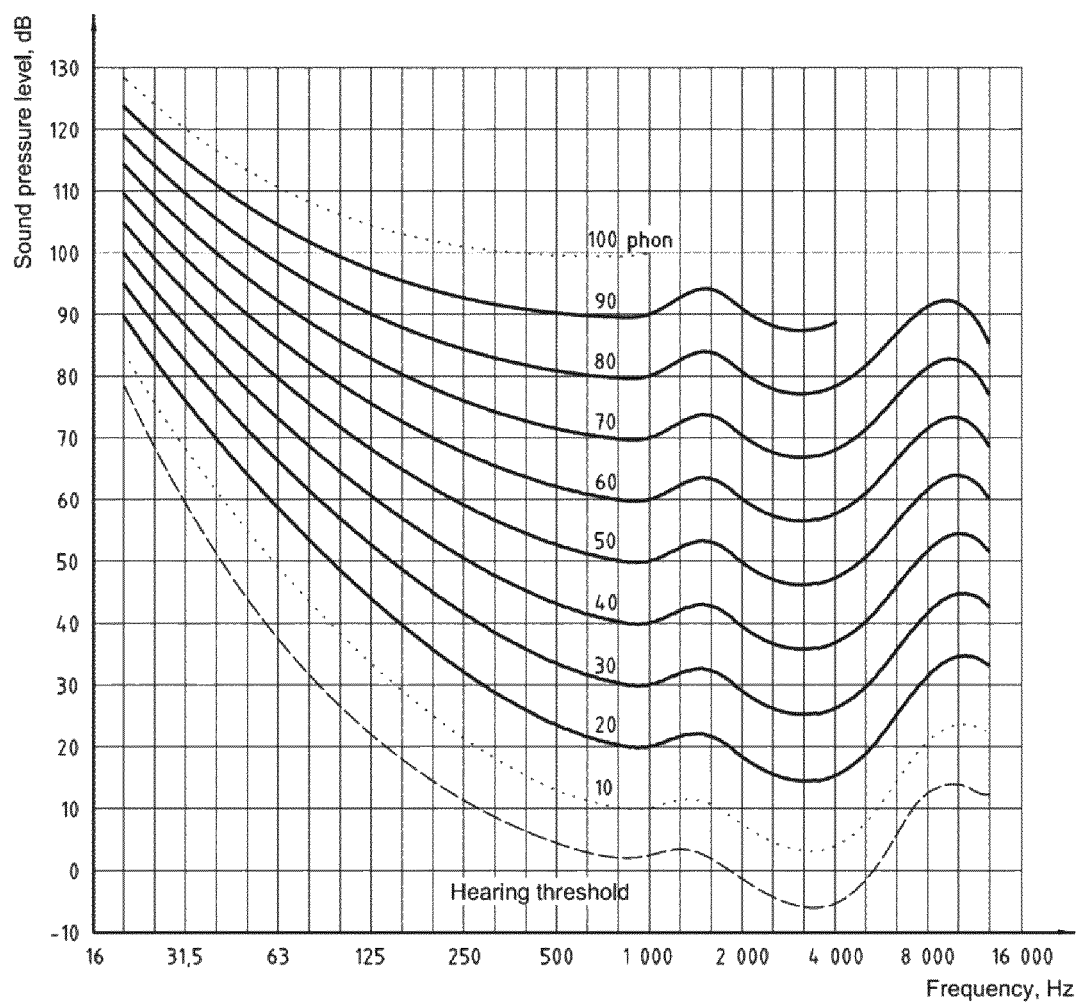
FIG. 1 shows normal equal-loudness-level contours for pure tones under free-field listening conditions as defined in International Standard ISO226-2003.

The embodiments described below in more detail provide a method comprising determining feature values from an input audio window and determining model parameters from the input audio window based on the processing of feature values using a neural network.

The input audio window may be obtained by windowing from an input audio file, or the input audio window may be a complete input audio file. Windowing may be done according to a standard procedure in signal processing. For example, windowing may be performed by defining a length of each window and by defining a hop size. The term audio window as used in the description of the embodiments below should also comprise using only a single window, the length of the window being equal to the length of an input audio file, i.e. the case where a single window covers a whole input file.

According to the embodiments, the model parameters are defined by a model of the weighted spectrum of an audio window. Model parameters may be any parameters that, based on an underlying model, may describe a target spectrum for the audio window. For example, a model may be a linear model and model parameters may include cut off frequencies and slope values that are defined by the model.

The method may further comprise equalizing the audio window based on the model parameters. This may allow an automatic profile equalization of audio. This equalizing may result in an automatically balancing of the perceived spectrum of the audio content of the audio window.

The method may further comprise determining a target spectrum for the input audio window based on the model parameters.

According to the methods disclosed here, the model parameters may automatically be set to an ideal value for a given loudness. The ideal value may for example be determined in advance by training a neural network.

The method may further comprise matching a window's spectrum to the model. This matching a window's spectrum to the model may result in equalizing an audio window in respect to the model. This matching of a window's spectrum to the model may also be called spectral envelope matching. The spectral envelope of the audio window is matched to the spectral envelope of the target spectrum defined by the model and its parameters.

This matching of a window's spectrum to the model may for example be implemented by determining a power spectrum from the audio window and, in logarithmic scale, subtracting the power spectrum from the target spectrum to obtain gain values.

The method may further comprise determining a weighted spectrum from the input audio window, determining a power spectrum from the weighted spectrum and, in logarithmic scale, subtracting the power spectrum from the target spectrum to obtain gain values.

Determining a weighted spectrum from the input audio window may comprise weighting the input audio window with an equal-loudness-level contour. The equal-loudness-level contour may for example be an ISO226-2003 contour. A perceived spectrum obtained from the weighted spectrum thus may derive from the psychoacoustically weighting of the physical spectrum. This weighting may change according to the loudness of the content, e.g. dependent on a target monitoring loudness.

The equal loudness-level contour may for example be a negative loudness equal-loudness-level contour (ELC). In this regard, the embodiments describe providing equal loudness response data defining a dependency between sound pressure level and frequency, resulting in sounds of equal loudness, including for sounds of a notional negative loudness. The method may further comprise selecting the equal-loudness-level contour based on a target monitoring loudness. If negative loudness equal-loudness-level contours (ELC) are available, the target monitoring loudness may in particular be a negative loudness.

Weighting the input audio window with an equal-loudness-level contour may comprise transforming the input audio window to the spectral domain and multiplying the obtained spectrum with a processed equal-loudness-level contour. The process according to the embodiments may thus enable to extract and process properties of an audio content (the source), so that a new audio content (the destination) can be generated, which is balanced in terms of perceived spectrum given a target monitoring loudness.

According to a further embodiment, the features may comprise values of the power spectrum of the input audio window.

According to an embodiment, the features may comprise a spectral peak salience or spectral formant salience of the input audio window.

According to a further embodiment, the features may comprise the spectral flatness or Wiener entropy of the power spectrum of the input audio window.

The features mentioned here are given only for exemplifying the process. Due to the nature of neural networks there can be many combinations of features that may be used in the context of the present disclosure.

The neural network may be trained in advance with a collection of input audio windows by manually setting, for each window, the model parameters so that the processed audio window appears the best sounding possible. That is, the neural network is trained using, as an input, the feature values, and as an output, the formant attenuation/amplification coefficient determined by humans, so that the processed audio window appears the best sounding possible.

The methods as described above may for example be applied in an automatic audio mastering framework. For example, the solution may be deployed in a DAW, e.g. in a real-time audio plug-in that does automatic profile equalization.

The methods may be computer-implemented methods. For example, the methods may be implemented as a software application, a digital audio workstation (DAW) software application, or the like. The methods may also be implemented as a software plug-in, e.g. for use in a digital audio workstation software.

The embodiments further provide an electronic device comprising circuitry configured to perform the methods. The methods may for example be implemented in an electronic device comprising circuitry configured to perform the methods described above and below in more detail. The electronic device may for example be a computer, a desktop computer, a workstation, a digital audio workstation (DAW), or the like. The electronic device may also be a laptop, a tablet computer, a smartphone or the like. Circuitry of the electronic device may include one or more processors, one or more microprocessors, dedicated circuits, logic circuits, a memory (RAM, ROM, or the like), a storage, output means (display, e.g. liquid crystal, (organic) light emitting diode, etc.), loud speaker, an interface (e.g. touch screen, a wireless interface such as Bluetooth, infrared, audio interface, etc.), etc.

Target Monitoring Loudness

According to the embodiments described below, the target monitoring loudness is the median loudness at which the result will be monitored.

Given a result, different target monitoring loudness values may provide a different profile equalization. The embodiments described below provide ways to extract and process properties of the input audio files so that, given a target monitoring loudness, the profile equalization is optimized for a given target monitoring Accordingly, the automatic mixing framework presented in the embodiments below integrates the monitoring level as a parameter (see e.g. 20 in FIG. 2).

In an audio processing chain, e.g. of an automated mixing framework, the target monitoring level may be set by the user in advance. Also, the target monitoring level may be derived from configurations of a main channel output level, settings of an audio interface and/or from settings of a speaker system that is used to output audio. An automated mixing framework may for example be configured so that, if a user does not provide a specific setting for the target loudness, by default, mixes are produced for medium listening levels.

Still further, on low-grade systems, the bass frequencies are attenuated, and tracks rich in low frequencies are perceived as less loud. Therefore, the principle of awareness of the target loudness awareness may be extended to a concept "mixed at the same loudness at a given monitoring level, on a given range of speakers". Embodiments may thus exploit the knowledge of the co-linearity of loudness measurement distortion brought by monitoring level and monitoring grade. The modification of the mix balance resulting from the grade of the monitoring system is comparable to the modification of the mix balance resulting from the monitoring level. The two dimensions are co-linear and can be reduced as one. In view of this, the exemplifying processes described below take account of only one parameter which may account for by monitoring level and/or monitoring grade. As an example, the resulting combination of the monitoring level and the speaker range may be set to 50 phon as default.

Equal-Loudness-Level Contours

FIG. 1 shows normal equal-loudness-level contours for pure tones under free-field listening conditions as defined in International Standard [150226-2003]. In the following, theses contours are called ISO226-2003 contours. International Standard [150226-2003] specifies combinations of sound pressure levels and frequencies of pure continuous tones which are perceived as equally loud by human listeners. An ISO226-2003 contour relates to a specific target monitoring loudness (expressed in phon) and defines a sound pressure level (in dB) for each frequency (in Hz).

Figure 2:
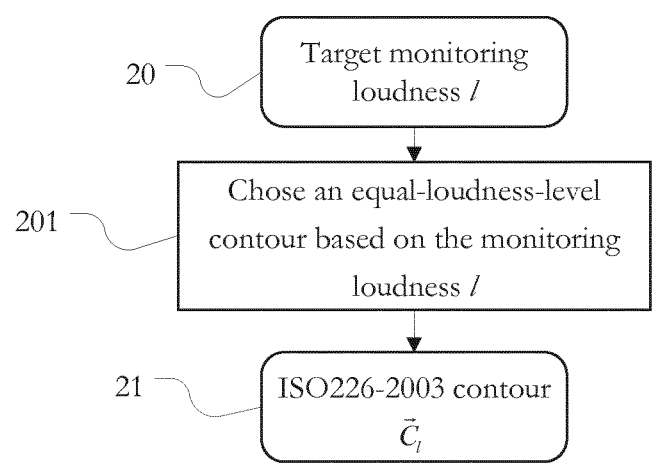
FIG. 2 schematically describes a process of selecting an equal-loudness-level contour, e.g. an ISO226-2003 contour, based on a given target monitoring loudness.

FIG. 2 schematically describes a process of selecting an equal-loudness-level contour, e.g. an ISO226-2003 contour, based on a given target monitoring loudness. A target monitoring loudness 20 is provided in advance.

Let $\vec{C}_l$ be the equal-loudness-level contour at loudness l, interpolated so that its number of elements is $N_{whole}$ This target monitoring loudness may be noted and expressed in phon.

In FIG. 2, at 201 an equal-loudness-level contour is chosen based on the given target monitoring loudness 20. The respective equal-loudness-level contour may for example be obtained from International Standard ISO226-2003 described above. If, for example, the target monitoring loudness is 50 phon, the 50-phon contour will be chosen. ISO226-2003 provides in section 4.1 equations for deriving sound pressure levels from a loudness level, these sound pressure levels defining the resulting ISO226-2003 contour. Selecting an appropriate equal-loudness-level contour may for example be realized by adequately setting the loudness level parameter in these equations. Alternatively, multiple equal-loudness-level contours for a set of given loudness levels may be stored in a memory and selecting the equal-loudness-level contour may be realized by choosing the appropriate equal-loudness-level contour from the set of multiple equal-loudness-level contours based on the given loudness level.

The skilled person will readily appreciate that the embodiments described below do not necessarily have to rely on equal-loudness-level contours according to ISO226-2003. Alternative embodiments may use other equal-loudness-level contours such as Fletcher-Munson contours or Robinson-Dadson contours.

Automatic Profile Equalization for a Given Monitoring Loudness

Figure 3:
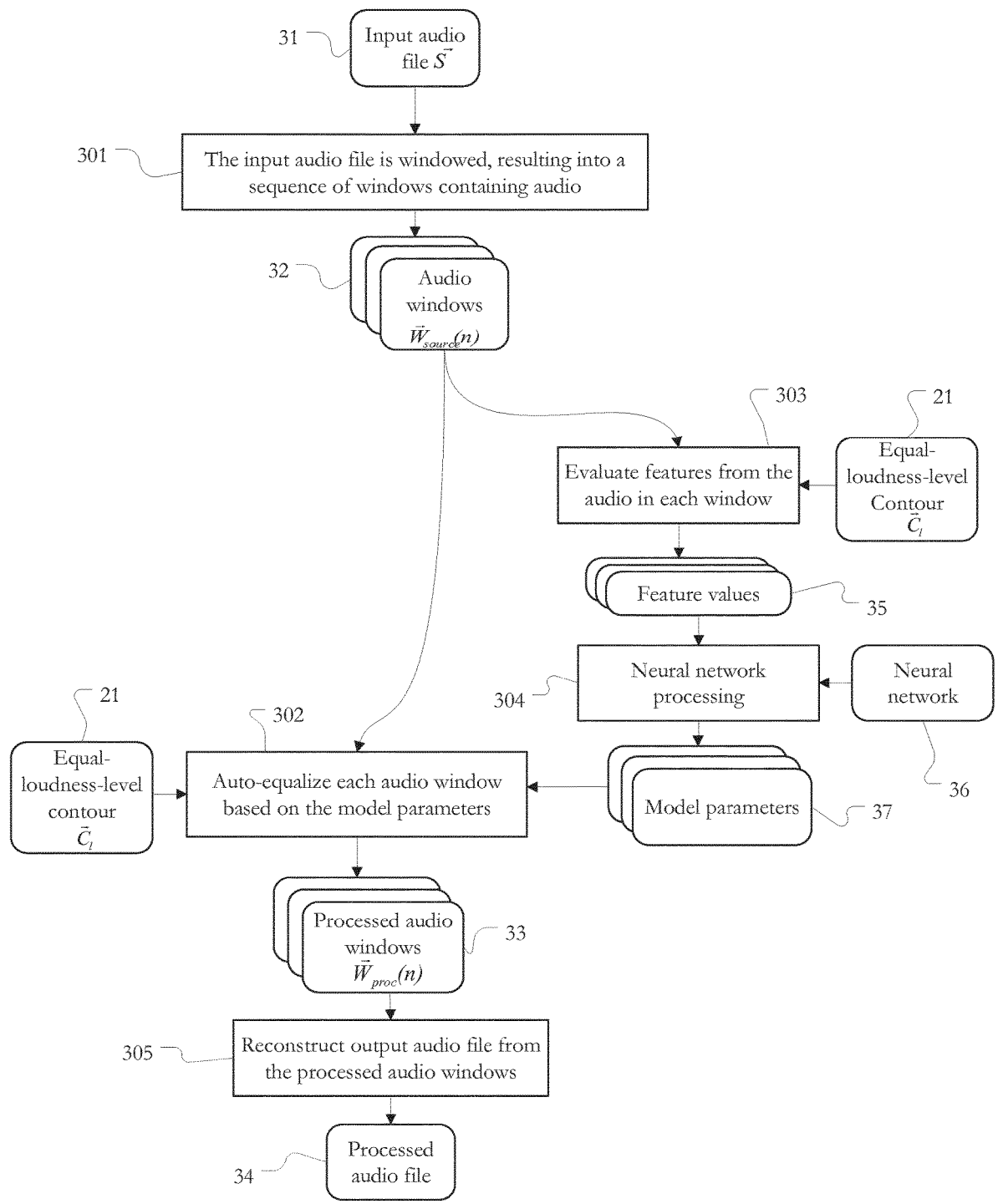
FIG. 3 schematically describes a first process of automatically equalizing an input audio file to produce a processed audio file.

FIG. 3 schematically describes a first process of automatically equalizing an input audio file to produce a processed audio file.

According to this embodiment the input file is mono, so that a mono version embodiment of the process will be used. If the input file is stereo, a stereo version of the process will be used which is described in section "Stereo file" in more detail.

The input of the process is a mono audio file 31.

The output of the process is a processed mono audio file 34.

Let $\vec{S}$ be the input audio file. Let $f_s$ be its sampling frequency.

Let $N_{whole}$ be the number of samples on the audio file.

At 301, the input audio file 31 is windowed, resulting into a sequence 301 of possibly overlapping windows containing audio. Windowing is standard procedure in signal processing (see e.g. [Lartillot 2014]). In the embodiment described here, the windowing process is performed as follows:

Let the $n^{th}$ window be written $\vec{W}_{source}(n)$

Let $N_{window}$ be the length of each window. Let $h_{window}$ be the hop size, with $h_{window} \leq N_{window}$.

Typical values are $N_{window} = 1 \times f_s$ samples, and $h_{window} = 0.5 \times f_s$ samples.

The $n^{th}$ window $\vec{W}_{source}(n)$ contains the audio samples $1+((n-1) \times h_{window})$ to $N_{window}+((n-1) \times h_{window})$.

For the audio in each window 32, the procedure described at 302, 303 and 304 is applied.

The process 302 of auto-equalizing each audio window based on the model parameters depends on the choice of an equal-loudness-level contour 21 such as an equal-loudness-level contour 21 that is derived from the given loudness parameter (20 in FIG. 2) as described with regard to FIG. 2 above. For example, if the target monitoring loudness is 50 phon, the 50-phon contour will be chosen.

Let $\vec{C}_l$ be the contour at loudness l.

At 302, the input audio file is auto-equalized based on the model parameters 37 provided by a neural network 36 from features values 35 described in more detail in section "Features for inputting to the neural network" below. An example process of determining a weighted spectrum of the audio window is described with regard to FIG. 4 and the corresponding description. An example process of auto-equalizing the audio windows based on the model parameters is described in more detail in FIG. 5 and FIG. 6 and the corresponding description below.

At 303, features values 35 are evaluated from the audio in each window 32. The feature values 35 are described in more detail in section "Features for inputting to the neural network" below. The process 303 of evaluating the feature values 35 depends on the selected equal-loudness-level contour $\vec{C}_l$, i.e on the given monitoring loudness (see FIG. 2).

At 304, for each window, the features (e.g. the values representing these features) are fed to a neural network 36. For example, one forward pass of the neural network 36 produces for each audio window 32 respective model parameters 37 that are suited to the audio of this audio window. As described in more detail with regard to FIG. 7 and in section "Training the neural network" below, the neural network 36 has been trained in advance for this task of evaluating model parameters 37 from input feature values 35.

At 305, the output audio file 34 is reconstructed from each window 33 of audio generated according to the process of 302.

In the output audio file, $\overrightarrow{W_{proc}}(n)$ (33 in FIG. 6) is set as the same position as $\overrightarrow{W_{source}}(n)$ 301 in FIG. 3) was in the input file.

In case of overlapping windows, a linear crossfade is used. Linear crossfading is standard procedure in signal processing.

In case $h_{window} < N_{window}$, the windows are overlapping (see 301 in FIG. 3 and corresponding description).

In this case, when setting, $\overrightarrow{W_{proc}}(n)$ (33 in FIG. 6) at its position in the output audio file, there exists a section of the output audio file in which non-zero audio samples are already present from a previous $\overrightarrow{W_{proc}}(n)$. The length of such an overlapped section is $N_{overlap}$, where $N_{overlap}=N_{window}-h_{window}$.

In this case, the $k^{th}$ sample in the overlapped section corresponding to the $n^{th}$ window, $\vec{S}(n)$, is defined by:

$$\vec{S}(n)[k] = \left(\frac{k}{N_{overlap}}\right) \times \overrightarrow{W_{proc}}(n+1)[k] + \left(1 - \left(\frac{k}{N_{overlap}}\right)\right) \times \overrightarrow{W_{proc}}(n)[h_{window} + k - 1].$$

Weighting the Spectrum with an Equal-Loudness Contour

FIG. 4a schematically describes a process of determining a psychoacoustically weighted spectrum of an audio window.

The weighted spectrum 43 is evaluated as follows.

Let "FFT" be the Fast Fourier Transform.

Let "cat" denote the concatenation of two vectors. Let ○ be the Hadamard product (also called "term-by-term" product).

At 401, the Fast Fourier Transform $FFT(\overrightarrow{W_{source}}(n))$ of the audio window $\overrightarrow{W_{source}}(n)$ is computed.

At 403, the contour $\vec{C_l}$ is interpolated so that its number of elements is $$\frac{N_{window}}{2}.$$

At 404, the contour $\vec{C_l}$ is expressed on a linear scale, with $$\vec{C_l} = 10^{\frac{\vec{C_l}}{20}}.$$

At 405, the contour $\vec{C_l}$ is symmetrized, i.e.

$$\vec{C_l} = cat\left(\vec{C_l}\left[1 \ldots \frac{N_{window}}{2}\right], \vec{C_l}\left[\frac{N_{window}}{2} \ldots 1\right]\right).$$

At 402, the $n^{th}$ (psychoacoustically) weighted spectrum $\vec{X}_{weighted}(n)$ is determined by multiplication as $$\vec{X}_{weighted}(n) = FFT(\overrightarrow{W_{source}}(n)) \circ \vec{C_l}$$

Model of the Weighted Spectrum

Figure 8A:
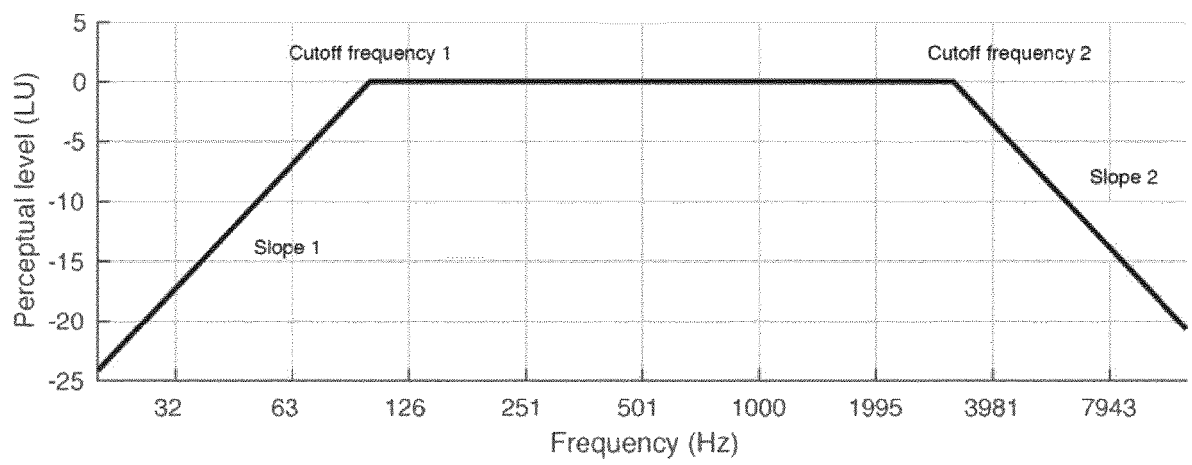
FIG. 8a schematically describes a model of the psycho-acoustically weighted spectrum obtained as described with regard to FIG. 4 above.

FIG. 8a schematically describes a model of the psychoacoustically weighted spectrum.

The model of the (psychoacoustically) weighted spectrum is defined as a piecewise function constructed from three linear functions in a logarithmic frequency and amplitude space. The slope of the first function ("slope 1" in FIG. 8b) is positive. The slope of the second function is zero. The slope of the third function is negative ("slope 2" in FIG. 8b).

The model has four parameters: the slope of the first function (slope 1), the frequency at which the first function ends (cut-off frequency 1), the slope of the third function (slope 2), and the frequency at which the third function starts (cut-off frequency 2).

Figure 8B:
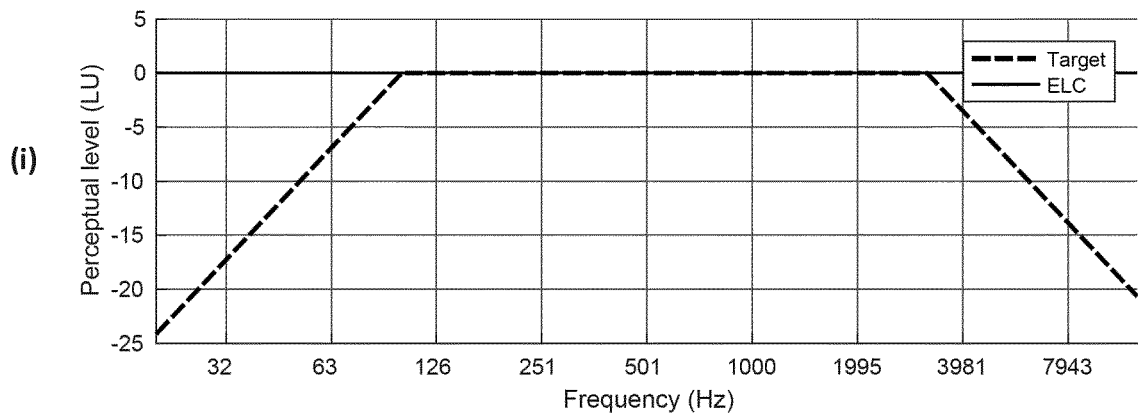
FIGS. 8b-d show an example of the model for different values of the model parameters and how the model, expressed in the perceptual domain, translates in the physical domain.
Figure 8B:
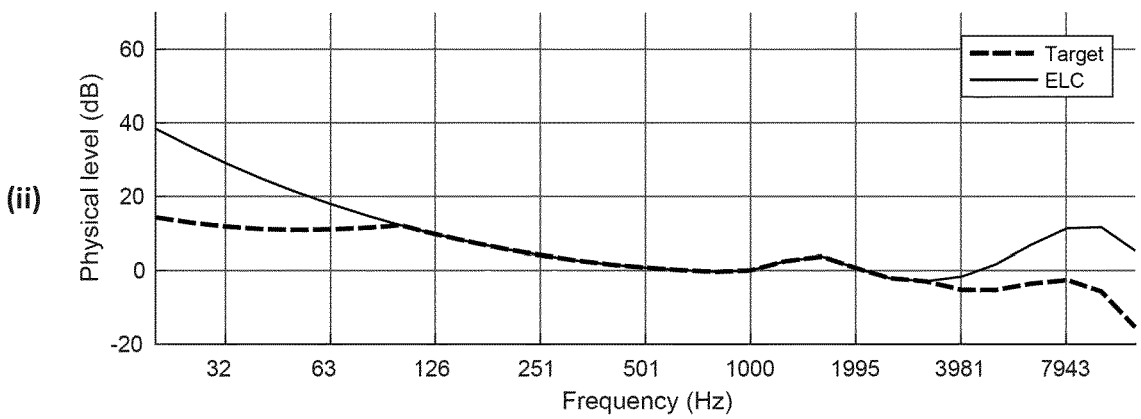
Figure 8B:
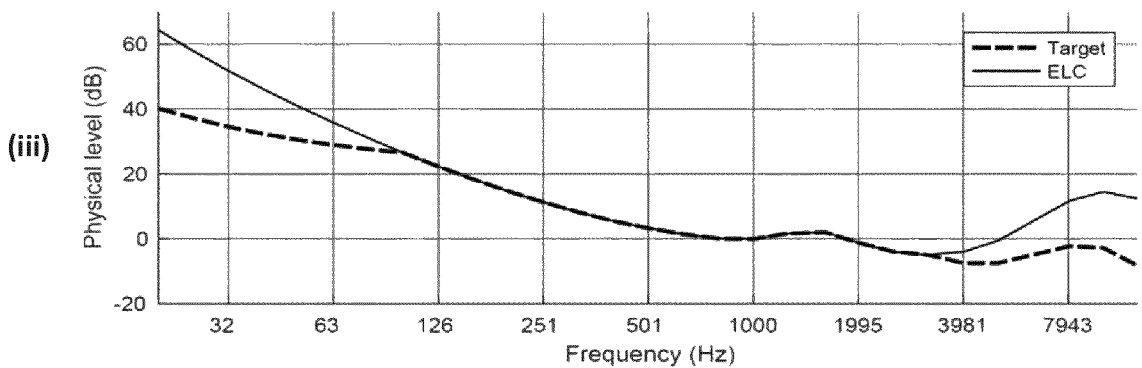
Figure 8C:
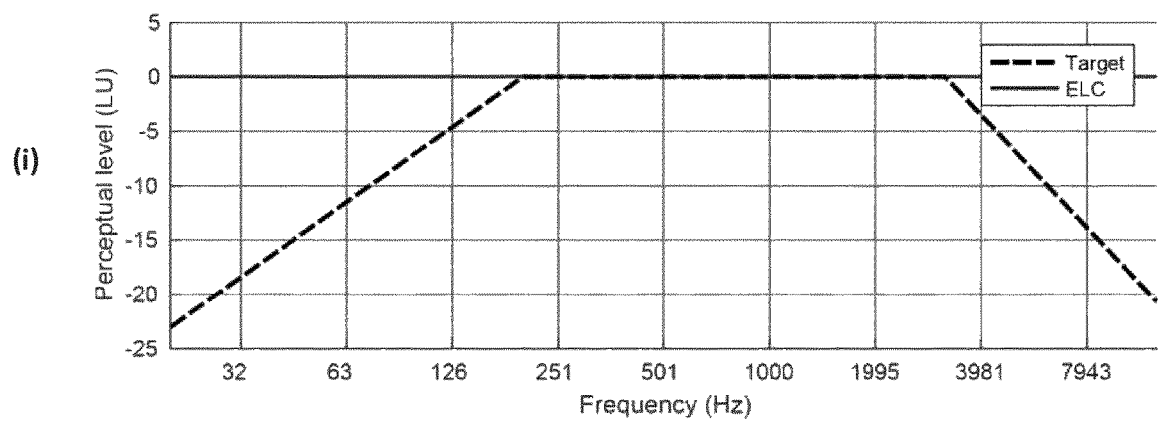
Figure 8C:
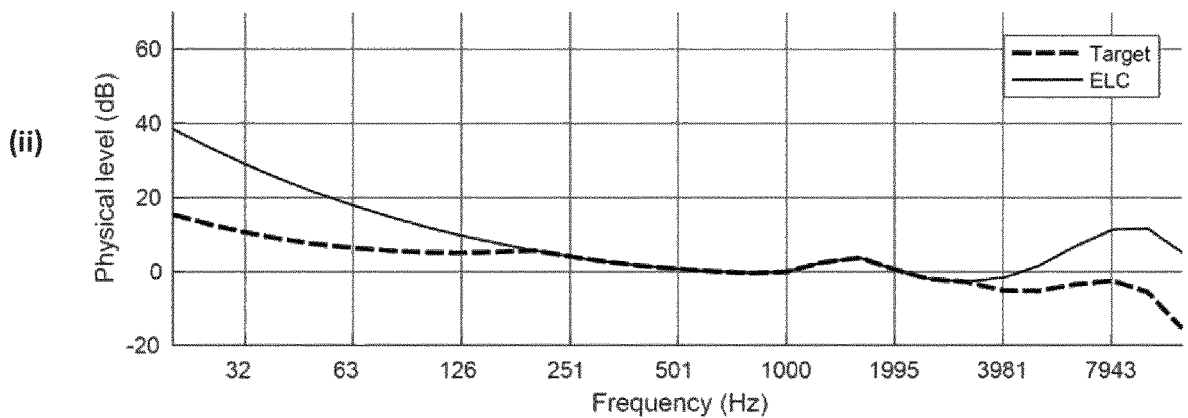
Figure 8D:
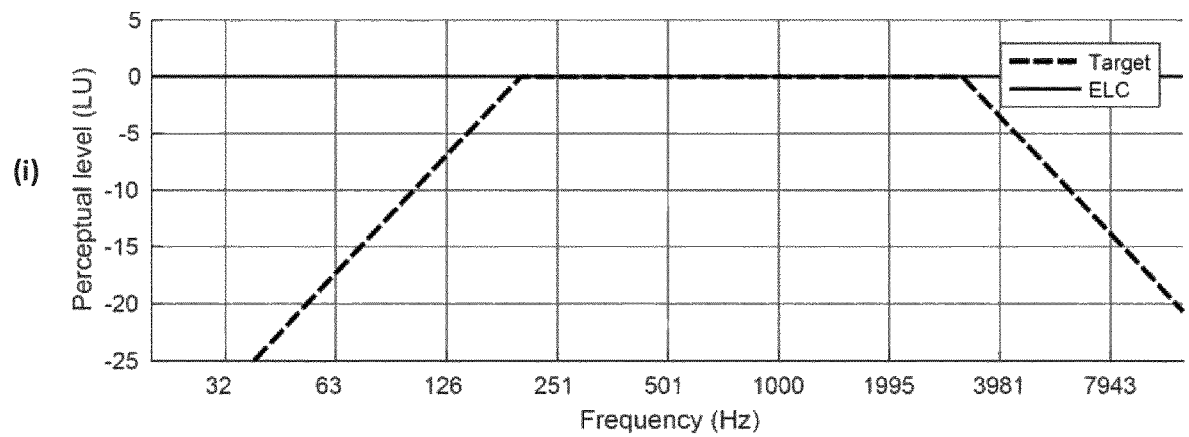
Figure 8D:
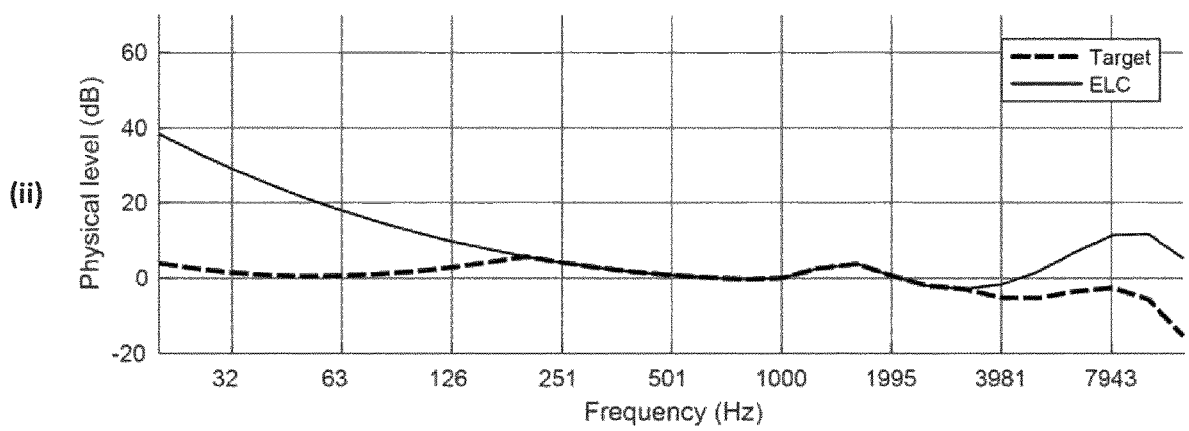

FIGS. 8b-d show an example of the model for different values of the model parameters. They also show how the model, expressed in the perceptual domain, translates in the physical domain.

FIG. 8b i) shows the model of the weighted spectrum in the perceptual domain, for the parameters cut-off frequency 1=100 Hz, cut-off frequency 1=3000 Hz, slope 1=0.4 dB/octave, and slope 2=−10.4 dB/octave. FIG. 8b ii) shows how this model, expressed in the perceptual domain, translates in the physical domain for a target loudness of 31 phon. FIG. 8b iii) shows how this model, expressed in the perceptual domain, translates in the physical domain for a target loudness of 81 phon.

FIG. 8c i) shows the model of the weighted spectrum in the perceptual domain, for the parameters cut-off frequency 1=200 Hz, cut-off frequency 1=3000 Hz, slope 1=6.9 dB/octave, and slope 2=−10.4 dB/octave. FIG. 8c ii) shows how this model, expressed in the perceptual domain, translates in the physical domain for a target loudness of 81 phon.

FIG. 8d i) shows the model of the weighted spectrum in the perceptual domain, for the parameters cut-off frequency 1=200 Hz, cut-off frequency 1=3000 Hz, slope 1=10.4 dB/oct, and slope 2=−10.4 dB/octave. FIG. 8d ii) shows how this model, expressed in the perceptual domain, translates in the physical domain for a target loudness of 81 phon.

Determining the Gain

Figure 5:
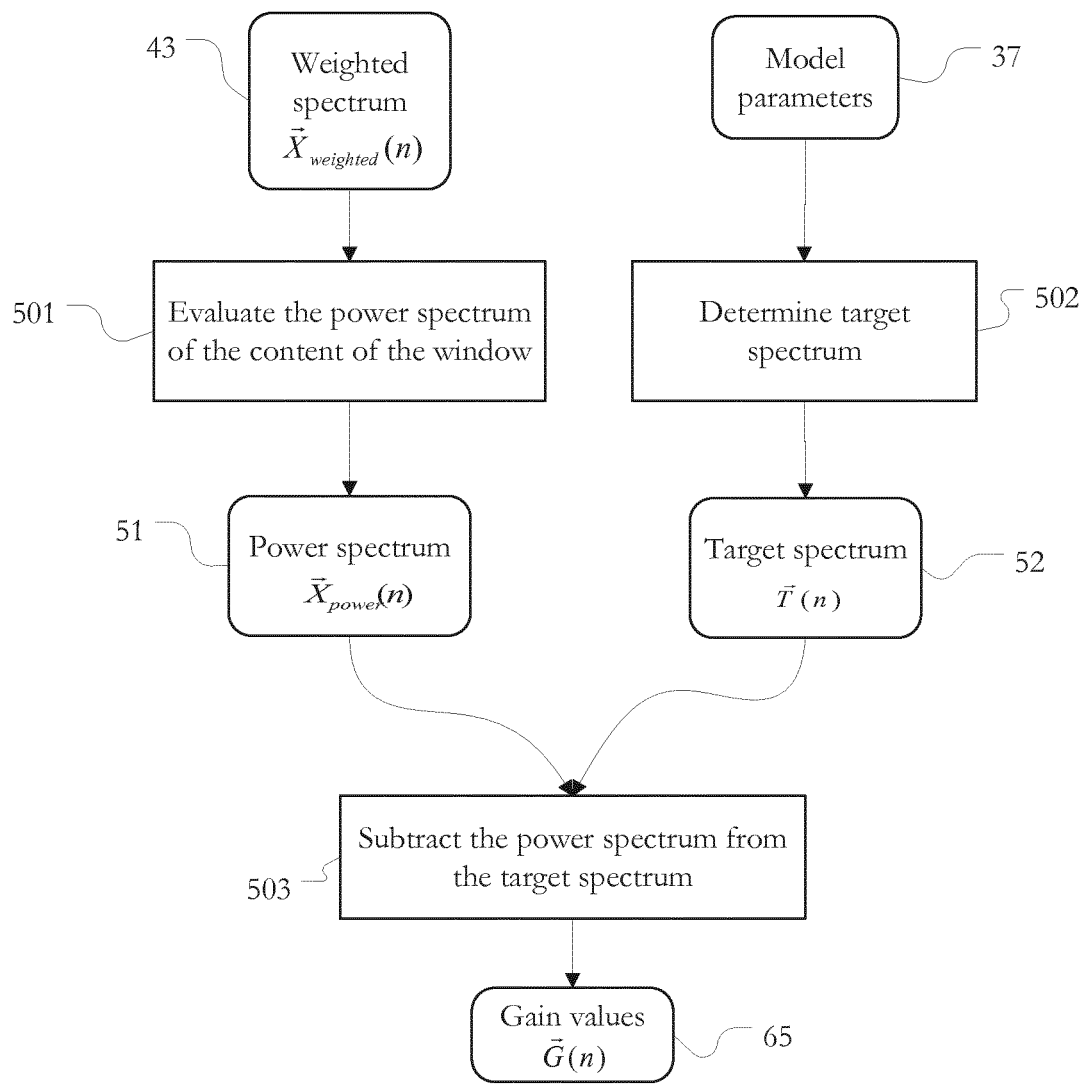
FIG. 5 schematically describes a process of spectral envelope matching for determining the gain from the weighted spectrum.

FIG. 5 schematically describes a process of spectral envelope matching for determining the gain from the weighted spectrum.

Figure 4:
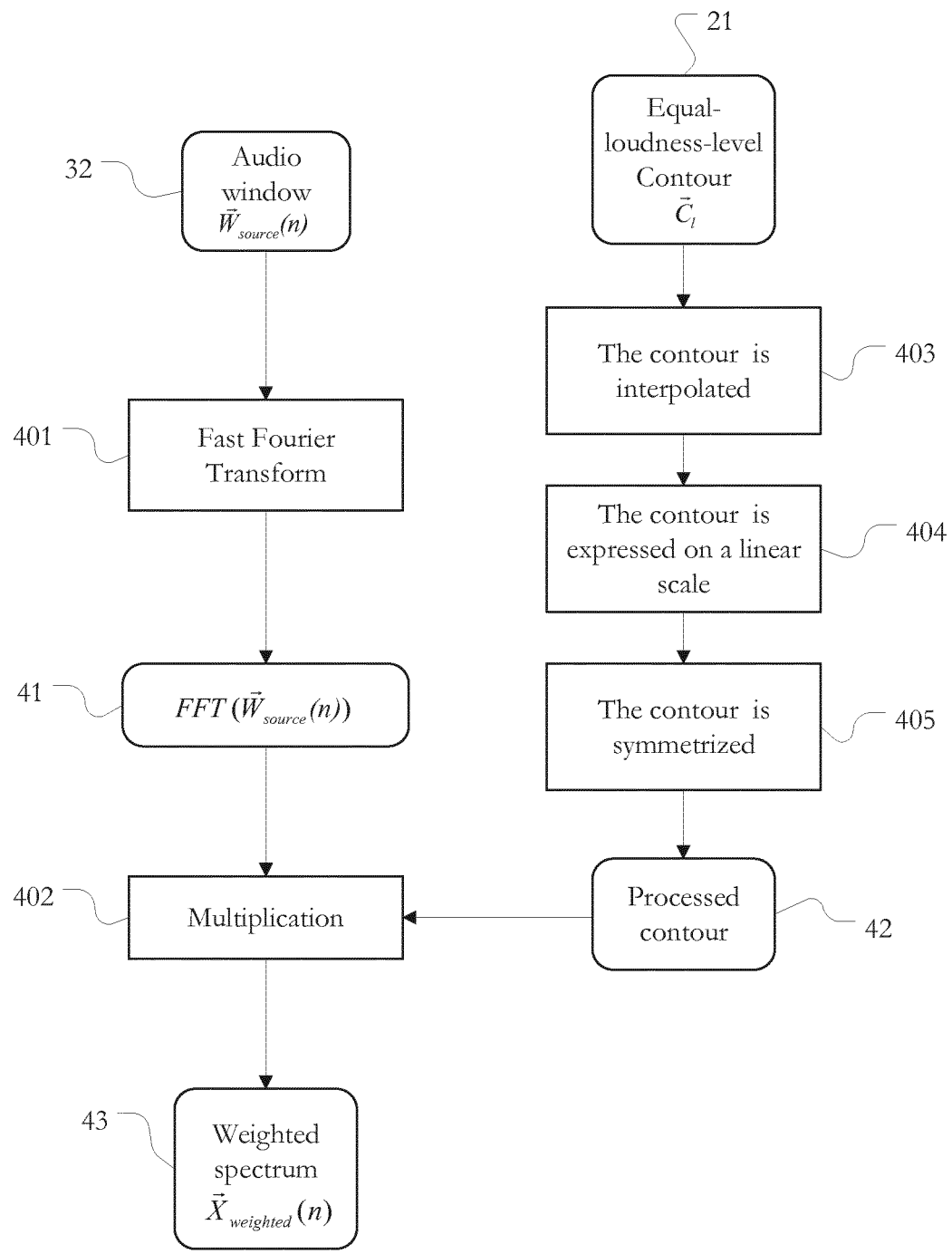
FIG. 4 schematically describes an example process of determining a weighted spectrum of the audio window.

At 501, from the weighted spectrum 43 as obtained according to the process of FIG. 4, the power spectrum 51 is evaluated. The power spectrum is expressed on a logarithmic frequency scale and a logarithmic amplitude scale.

The $n^{th}$ power spectrum $\vec{X}_{power}(n)$ is defined as the elements 1 to $N_{window}/2$ of $(\vec{X}_{weighted}(n))^2$.

The $n^{th}$ power spectrum is expressed in logarithmic amplitude scale as $$\vec{X}_{power}(n) = 20 \times \log 10 \ (\vec{X}_{power}(n)).$$

The following procedure is performed to obtain the power spectrum 52 with a number of $N_{bands}$ bands.

Expression of the $n^{th}$ power spectrum in logarithmic frequency scale is performed as:

A number of $N_{bands}+1$ evenly spaced frequencies on a logarithmic scale are defined by $$f_{log} = logspace\left(\log(20), \log\left(\frac{f_s}{2}\right), N_{bands} + 1\right).$$

Writing $f_{log} = [f_1, f_2, \ldots f_{N_{bands}+1}]$, the $k^{th}$ band is the ensemble of values contained in the interval $[f_k f_{k+1}]$.

The $k^{th}$ power spectrum value is defined as the mean of the values contained in the $k^{th}$ band.

The power spectrum as expressed on a logarithmic frequency scale and a logarithmic amplitude scale has $N_{bands}$ elements, and is expressed in dB.

This results in the power spectrum $\vec{X}_{power}(n)$.

A typical number of bands in for the power spectrum is 20. A right number of bands is defined empirically in advance. Too few bands will not conform the input file's spectrum to the target spectrum. Too many bands will result into an overly constrained result that doesn't sound anything like natural.

At 502, a target spectrum 52 is constructed for the weighted spectrum 43 from the model defined in section "Model of the weighted spectrum" above using the parameters evaluated in 304 of FIG. 3. The target spectrum 52 is built on a logarithmic frequency scale and a logarithmic amplitude scale.

Let $\vec{T}(n)$ be the target spectrum for the $n^{th}$ window as obtained according to the process described with regard to FIG. 5. Its number of elements is $N_{bands}$. It is expressed in dB.

At 503, the log-log power spectrum $\vec{X}_{power}(n)$ is subtracted from the target $\vec{T}(n)$, resulting into a vector of values, the gains.

The gains for the $n^{th}$ window $\vec{G(n)}$ are defined as $\vec{G}(n) = \vec{T}(n) - \vec{X}_{power}(n)$.

Equalizing the Spectrum to the Target Spectrum

Figure 6:
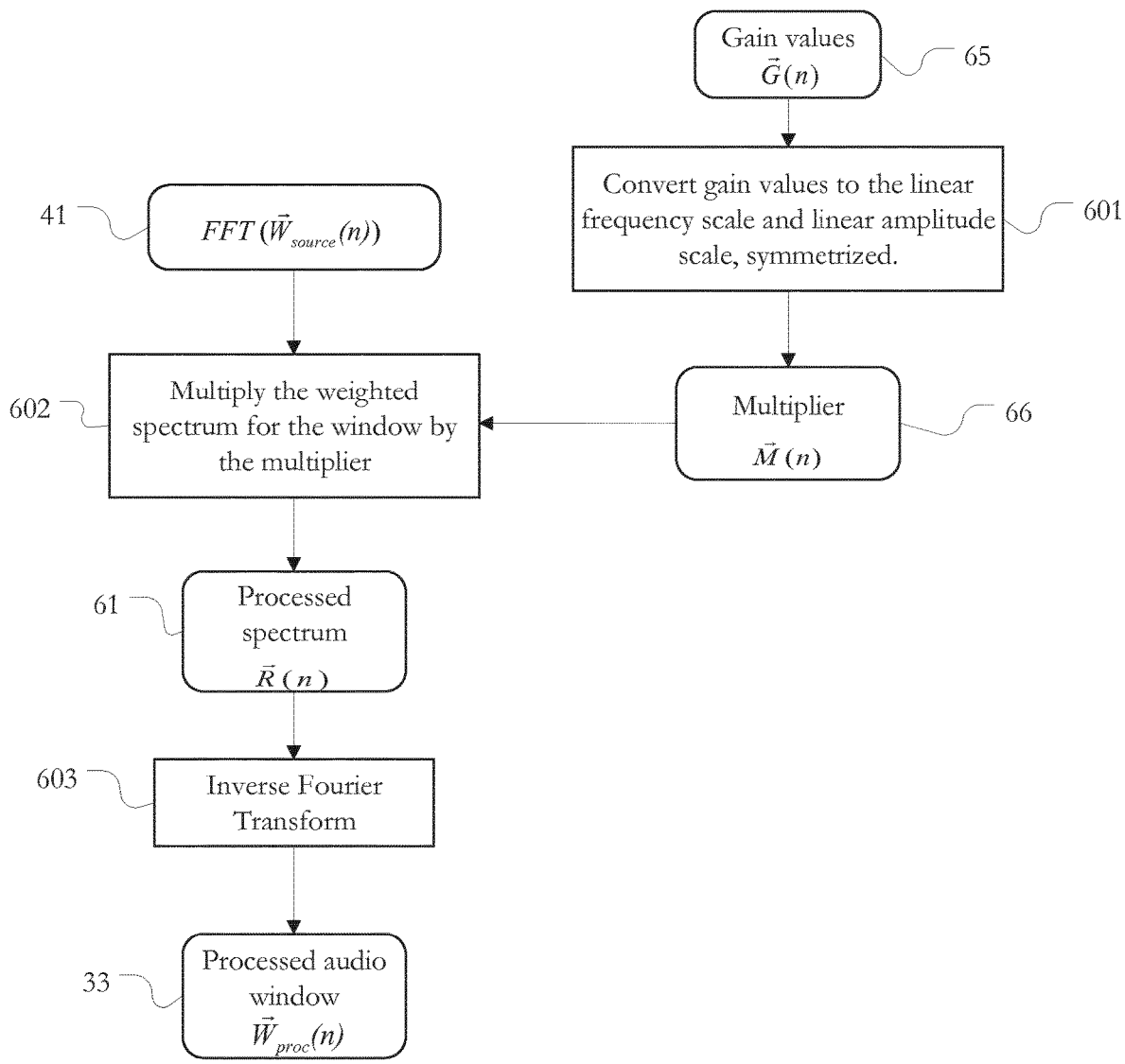
FIG. 6 schematically describes the process of equalizing the weighted spectrum to the target spectrum.

FIG. 6 schematically describes the process of equalizing the weighted spectrum to the target spectrum.

At 601, the gains 65 ($\vec{G(n)}$) obtained as described with regard to FIG. 5 above are interpolated, symmetrized and converted into the linear domain to obtain a multiplier 66, $\vec{M}(n)$.

The gains are interpolated so that their number of element is $$\frac{N_{window}}{2}.$$

The vector containing the gains for the $n^{th}$ window, $\vec{G(n)}$, has now $$\frac{N_{window}}{2}$$

elements.

A vector of values called "unfolded gain" values are produced from the concatenation of the gain values (PM11) with the gain values reversed.

Let "cat" denote the concatenation of two vectors.

The gains $\vec{G(n)}$ are symmetrized, i.e.

$$\vec{G(n)} = cat\left(\vec{G(n)}\left[1\ldots\frac{N_{window}}{2}\right], \vec{G(n)}\left[\frac{N_{window}}{2}\ldots 1\right]\right).$$

The vector containing the gains for the $n^{th}$ window, $\vec{G(n)}$, has now $N_{window}$ elements.

The unfolded gain values are converted into the linear domain, resulting into the multiplier.

Let $\vec{M}(n)$ be the multiplier for the $n^{th}$ window. $\vec{M}(n)$ is defined as $$\vec{M}(n) = 10^{\wedge}\left(\frac{\vec{G}(n)}{20}\right).$$

At 602, the weighted spectrum 43 for the window obtained according to the process described with regard to FIG. 4 is multiplied by the multiplier $\vec{M}(n)$. This results into the processed spectrum 61.

Let $\circ$ be the Hadamard product.

Let FFT ($\vec{W}_{source}(n)$) be the complex spectrum for the $n^{th}$ window as in 41 of FIG. 4.

The $n^{th}$ processed spectrum $\vec{R}(n)$ is defined as $\vec{R}(n) = $ FFT $(\vec{W}_{source}(n)) \circ \vec{M}(n)$.

At 603, the processed spectrum 61 is transformed back into the time domain using an inverse discrete Fourier transform. This results into the processed audio 33.

Let iFFT be the inverse fast Fourier transform.

Let $\vec{W}_{proc}(n)$ be the processed audio content 33 for the $n^{th}$ window.

$\vec{W}_{proc}(n)$ is defined as $\vec{W}_{proc}(n) = $iFFT$(\vec{R}(n))$.

If some imaginary residue remains in $\vec{W}_{proc}(n)$, then $\vec{W}_{proc}(n) = $real$(\vec{W}_{proc}(n))$.

Processing of a Stereo File

In the following, a stereo version of the processes is described.

The stereo version of the process evaluates the mean between the spectra for the two channels and uses this mean in the spectral envelope matching procedure for both channels. This avoids the damaging of the stereo image done by the processing of each channel by the mono version.

The process starts from a stereo input audio file and results into a stereo input audio file.

Let $\vec{S}_L$ and $\vec{S}_R$ be the input audio file. Let $f_s$ be its sampling frequency.

Let $N_{whole}$ be the number of samples on the audio file.

The choice of an equal-loudness-level contour such as an ISO226-2003 contour is derived from the given loudness as described with regard to FIG. 2. As with regard to the mono version of the processes, let $C_l$ be the contour at loudness l.

Both channels of the stereo input file are windowed, resulting into a sequence of possibly overlapping windows containing audio.

Let the $n^{th}$ windows be written $\vec{W}_L(n)$ and $\vec{W}_R(n)$.

$N_{window}$ is the length of each window and $h_{window}$ is the hop size, with $h_{window} \leq N_{window}$, as defined in the mono version of the process.

The $n^{th}$ windows $\vec{W}_L(n)$ and $\vec{W}_R(n)$ contain the audio samples $1+((n-1)\times h_{window})$ to $N_{window}+((n-1)\times h_{window})$ from $\vec{S}_L$ and $\vec{S}_R$ respectively.

For the audio in each window, the procedure described with regard to FIGS. 3 to 6 are applied, taking into account the modifications for a stereo file as described below.

Features (35 in FIG. 3) as described in section "Features for inputting to the neural network" below are evaluated from the audio in each window. The values for these features are fed to the neural network (36 in FIG. 3). For example, one forward pass of the neural network may produce the attenuation ratio (37 in FIG. 3) that is suited to the audio according to the training performed as described in section "Training the neural network" below.

The weighted spectrum is evaluated for both channels.

The $n^{th}$ weighted spectrum $\vec{X}_{wL}(n)$ is defined as $\vec{X}_{wL}(n) = $FFT$(\vec{W}_L(n)) \circ C_l$.

The $n^{th}$ weighted spectrum $\vec{X}_{wR}(n)$ is defined as $\vec{X}_{wR}(n) = $FFT$(\vec{W}_R(n)) \circ C_l$.

From the weighted spectra, the power spectra are evaluated.

The $n^{th}$ power spectrum $\vec{X}_{pL}(n)$ is defined as the elements 1 to $N_{window}/2$ of $(\vec{X}_{wL}(n))^2$.

The $n^{th}$ power spectrum $\vec{X}_{pR}(n)$ is defined as the elements 1 to $N_{window}/2$ of $(\vec{X}_{wR}(n))^2$.

The mean of the two power spectra in the linear domain is evaluated.

The $n^{th}$ power spectrum $\vec{X}_{power}(n)$ is defined as $\vec{X}_p(n)=0.5\times(\vec{X}_{pL}(n)+\vec{X}_{pR}(n))$.

For each channel, the mean power spectrum is obtained and a target spectrum is constructed from the model in using the parameters evaluated as described in FIG. 3 with regard to a mono file. The log-log mean power spectrum is subtracted from the target, resulting into a vector of values (the gains). The gains are interpolated and converted into the linear domain to obtain the multiplier $\vec{M}(n)$ as described with regard to FIG. 6 above.

The weighted spectra for the left and right window are multiplied by the inverse of the multiplier $\vec{M}(n)$. This results into the processed spectrum.

Let $\vec{X}_{procL}(n)$ and let $\vec{X}_{procR}(n)$ be the processed spectra for the $n^{th}$ window.

The $n^{th}$ left processed spectrum $\vec{X}_{procL}(n)$ is defined as $\vec{X}_{procL}(n)=FFT(\vec{W}_L(n))\circ\vec{M}(n)$.

The $n^{th}$ right processed spectrum $\vec{X}_{procR}(n)$ is defined as $\vec{X}_{procR}(n)=FFT(\vec{W}_R(n))\circ\vec{M}(n)$.

The processed spectrum is transformed back into the time domain using an inverse discrete Fourier transform. This results into the processed audio.

Let $\vec{W}_{procL}(n)$ and $\vec{W}_{procR}(n)$ be the processed audio contents for the $n^{th}$ window.

$\vec{W}_{procL}(n)$ is defined as $\vec{W}_{procL}(n)=iFFT(\vec{X}_{procL}(n))$.

$\vec{W}_{procR}(n)$ is defined as $\vec{W}_{procR}(n)=iFFT(\vec{X}_{procR}(n))$.

If some imaginary residue remains in $\vec{W}_{procL}(n)$, then $\vec{W}_{procL}(n)=real(\vec{W}_{procL}(n))$.

If some imaginary residue remains in $\vec{W}_{procR}(n)$, then $\vec{W}_{procR}(n)=real(\vec{W}_{procR}(n))$.

As described with regard to 305 of FIG. 3, the output audio file is reconstructed from each window of audio generated in 302 of FIG. 3.

In the output audio file, $\vec{W}_{procL}(n)$ is set as the same position as $\vec{W}_L(n)$ was in the input file.

In the output audio file, $\vec{W}_{procL}(n)$ is set as the same position as $\vec{W}_L(n)$ was in the input file.

In case of overlapping windows, a linear crossfade is used for each channel, as it is described with regard to the mono version of the process.

Training the Neural Network

Figure 7:
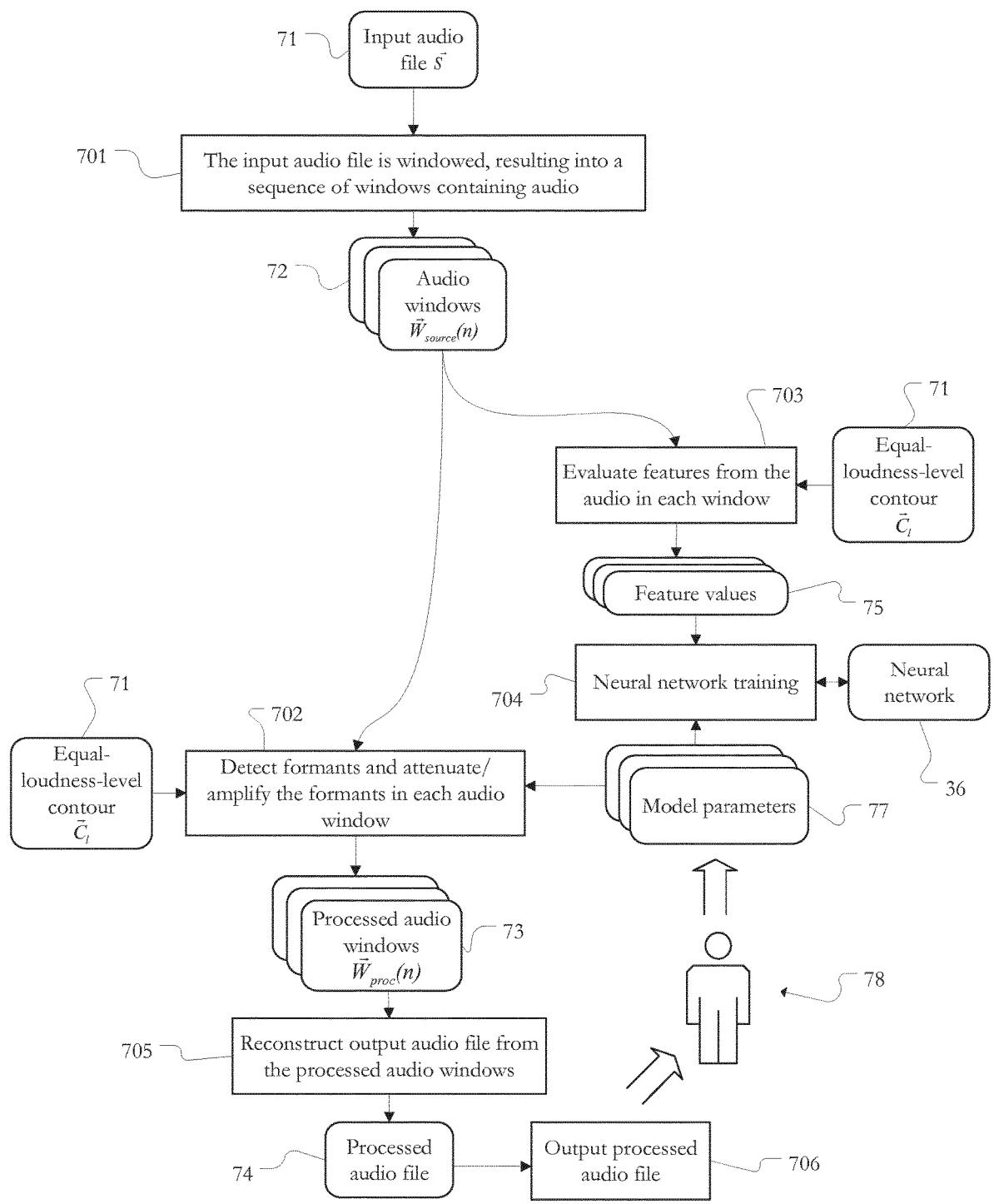
FIG. 7 schematically describes an exemplifying process of training a neural network on the basis of a dataset of audio files.

FIG. 7 schematically describes an exemplifying process of training a neural network on the basis of a dataset of audio files.

The process of training the neural network as described with regard to FIG. 7 corresponds to some extent to the process described with regard to FIG. 3 and the corresponding description, so that, here, only the differences are explained in more detail.

A dataset of audio files is gathered and provided as basis for the training process. The training process described below is performed with each audio file 31 from the gathered dataset of audio files.

At 703, features 51 are extracted from each audio file 31 in the dataset. An example set of features is detailed in section "Features" below. Other sets of features are possible.

For each input audio file, the features in obtained at 703 may be evaluated either on the entire file, or on the windowed file.

In the embodiment of FIG. 7, windowing is performed at 701. The windowing process may for example be performed as set out with regard to 301 in FIG. 3.

At 703, each audio window is fed into an audio process that matches the power spectrum of the input audio to the model of the weighted spectrum defined above. This process is the same process as described with regard to FIGS. 5 and 6 above.

For each window, the model parameters 77 are manually set by a human subject 78 so that the result, the processed audio file 74, appears the best sounding possible to the subject 78. The ensemble of such results (model parameters for audio windows 702) is referred to as the "ground truth". In order to allow the human subject 78 to evaluate the quality of the result 74, the processed audio file 74 is output, at 706, to the human subject 78, e.g. by a headphone unit or loudspeaker.

For each audio file, the parameters may be set either for the entire audio file, or may evolve dynamically during the course of the audio file.

At 704, given an equal-loudness-level contour 71 for a predetermined target loudness (20 in FIG. 2), a neural network 36 is trained with the feature values 75 obtained in 703 as an input, and the ground truth 77 evaluated by the human operator 78 as an output.

One possible configuration for a neural network 36 trained in 704 is a three-layer network with the following characteristics. The two first layers use ReLU as an activation function, the last layer uses a sigmoid as an activation function. If the number of input descriptors is $N_{in}$, then the hidden layer has $1.5\times N_{in}$ inputs and $N_{in}$ outputs. The loss function is the mean square error. According to an example, the gradient descent may be stochastic, using a batch size of 4000. The learning rate may be 0.3. The model may be trained for 50000 epochs.

Other configurations may be possible.

Given an equal-loudness-level contour (21 in FIG. 2) for a predetermined target loudness (20 in FIG. 2), once trained, the neural network 36 is able to generate model parameters (37 in FIG. 3), so that matching of the power spectrum of an input audio file to the model as described with regard to the process of FIG. 3 results in an optimal-sounding audio file (34 in FIG. 3) according to the training by the human subject 78. That is, the trained neural network may be used as the neural network (36 in FIG. 3) of the process described with regard to FIG. 3.

Features for Training the Neural Network

In the following, some example for features that may be used as input for a neural network are described in more detail. These features are derived from an input audio file (31 in FIG. 3, 71 in FIG. 7) as described with regard to the features (35 in FIG. 3, and feature values 75 in FIG. 7) used in the processes described in FIGS. 3 and 7.

Given the nature of neural networks, using different features may provide a similar result.

Each feature described below may be one input of the neural network. The features may also be combined to generate be one input of the neural network.

If the feature is windowed, then each window is an input vector for the neural network.

(F1) Values of the Power Spectrum

This feature set gathers the values of the power spectrum, expressed on a logarithmic frequency scale and a logarithmic amplitude scale. The measure can be windowed or global.

The power spectrum $\vec{X}_{power}$ as described with regard to 51 in FIG. 5 or the power spectrum expressed on a logarithmic amplitude scale as $\vec{X}_{power}=20\times\log10(\vec{X}_{power})$ may be bused as feature.

If the file is stereo, the result is the mean, in the linear amplitude domain, of the values for the two channels (see section "Processing a stereo file" above). The mean between the channels is performed in logarithmic frequency scale and linear amplitude scale, with $\vec{X}_{power}=0.5\times(\vec{X}_{pL}+\vec{X}_{pR})$.

Here, the number of bands in the measure is flexible. Typical values vary between 20 and 200 bands.

(F2) Spectral Peak Salience or Spectral Formant Salience

According to a further embodiment, a feature is the measure of spectral peak salience or spectral formant salience. This is a one-dimension feature.

The spectral peak salience or spectral formant salience of an audio window is obtained by determining the formants of the audio window as described below.

The input is an audio window.

Let $\vec{W}_{source}(n)$ be the $n^{th}$ audio window.

Let $N_{window}$ be the number of elements in the window.

The weighted spectrum of the audio window $\vec{W}_{source}(n)$ is evaluated as follows.

Let "FFT" be the Fast Fourier Transform.

Let "cat" denote the concatenation of two vectors. Let ○ be the Hadamard (also called "term-by-term" product).

At 401, the Fast Fourier Transform $FFT(\vec{W}_{source}(n))$ of the audio window $\vec{W}_{source}(n)$ is computed.

At 403, the contour $\vec{C}_l$ is interpolated so that its number of elements is $N_{window}/2$.

At 404, the contour $\vec{C}_l$ is expressed on a linear scale, with $$\vec{C}_l = 10^{\frac{\vec{C}_l}{20}}.$$

At 405, the contour $\vec{C}_l$ is symmetrized, i.e.

$$\vec{C}_l = cat\left(\vec{C}_l\left[1...\frac{N_{window}}{2}\right], \vec{C}_l\left[\frac{N_{window}}{2}...1\right]\right).$$

At 402, the $n^{th}$ weighted spectrum $\vec{X}_{weighted}(n)$ is determined by multiplication as $\vec{X}_{weighted}(n)=FFT(\vec{W}_{source}(n))\circ \vec{C}_l$.

From the weighted spectrum the power spectrum 51 is evaluated.

The $n^{th}$ power spectrum $\vec{X}_{power}(n)$ is defined as the elements 1 to $N_{window}/2$ of $(\vec{X}_{weighted}(n))^2$.

To obtain the formants, the power spectrum may be expressed twice on a logarithmic frequency scale and a logarithmic amplitude scale, each time using a different number of bands. The identification of the formants may be derived from the difference between one smoothed power spectrum and another smoothed power spectrum 53, the latter being smoothed more than the former, and both being expressed on a logarithmic frequency scale and a logarithmic amplitude scale.

There may be several methods to perform such an operation. The process described here in more detail relies on a solution according to which the spectra are expressed on a logarithmic frequency scale and a logarithmic amplitude scale using a number of discrete bands, with the first spectrum being expressed with less bands than the second spectrum. For example, in an exemplary real-time implementation, a first spectrum with 200 bands, and a second spectrum derived from the first with a low-pass filter may be used. Here, for illustrative purpose, a specification using two spectra with bands of different size are used.

The $n^{th}$ power spectrum is expressed in logarithmic amplitude scale as $$\vec{X}_{power}(n)=20\times\log10(\vec{X}_{power}(n)).$$

The following procedure described in section " " above is performed twice to obtain a first power spectrum and a second power spectrum, with two different values of $N_{bands}$.

This results into two power spectra, $\vec{X}_{p1}(n)$ and $\vec{X}_{p2}(n)$.

An exemplary number of bands is 40 for the first power spectrum 52, and 200 for the second spectrum 53. That is, a typical size for $\vec{X}_{p1}(n)$ may be 40 and a typical size for $\vec{X}_{p2}(n)$ may be 200. These values may be predefined as two configuration parameters of the process.

The first spectrum is subtracted from the second spectrum. This results into the measured formants.

Let $\vec{\varphi}(n)$ be the formant vector for the $n^{th}$ window.

$\vec{\varphi}(n)$ is defined as $\vec{\varphi}(n)=\vec{X}_{p2}(n)-\vec{X}_{p1}(n)$.

Like $\vec{X}_{p1}(n)$ and $\vec{X}_{p2}$, $\vec{\varphi}(n)$ is expressed on a logarithmic frequency scale and a logarithmic amplitude scale, e.g. the formants for the $n^{th}$ window $\vec{\varphi}(n)$ are expressed as $\vec{\varphi}(n)^{\vec{\varphi}(n)/20}$.

Finally, the RMS of the formants $\vec{\varphi}(n)$ is evaluated, resulting into the formant salience.

That is, the formant salience FS (n) for the $n^{th}$ window is defined as $$FS(n) = \sqrt{\frac{\Sigma \vec{\varphi}(n)^2}{N_{window}}}.$$

In case of a stereo file, the result is the mean of the two saliences.

(F3) Spectral Flatness or Wiener Entropy

According to a further embodiment, the measure of spectral flatness or Wiener entropy is used as feature for inputting to the neural network. It consists in the geometric mean of the power spectrum, divided by the arithmetic mean of the power spectrum. This is a one-dimension feature. In case of a stereo file, the result is the mean of the two flatness values.

The following provides the measure for one window, one channel.

Let "FFT" be the Fast Fourier Transform.

Let $\vec{W}_{source}$ be the input audio.

Let $N_{window}$ be the number of elements in $\vec{W}_{source}$.

The spectrum $\vec{X}$ is defined as $\vec{X}=FFT(\vec{W}_{source})$.

The power spectrum $\vec{X}_{power}$ is defined as the elements 1 to $N_{window}/2$ of $(\vec{X}_{weighted})^2$.

The spectral flatness is F, where $$F = \frac{\sqrt[N_{window}/2]{\Pi \vec{X}_{power}}}{\frac{1}{N_{window}/2} \times \Sigma \vec{X}_{power}}.$$

In case of a stereo file, the result is the mean of the two flatness values.

Equal-Loudness Contours for Negative Loudness Values

As already described with regard to FIG. 1 above, the human ear is not equally sensitive to all frequencies, which has prompted scientists to look for the physical level that a notional human ear requires to hear all frequencies at the same loudness. This results in the generation of so-called equal-loudness contours (ELCs) such as the so-called Fletcher-Munson curves or the ISO226-2003 standard curves.

An example representation of the ISO226-2003 curves is provided by FIG. 1 of the accompanying drawings. Each contour represents the physical level required for the ear to hear a pure sine tone at the same loudness, this level being measured in phon. By convention, physical and perceptual levels have the same value in the case of a 1000 Hz pure tone. In other words, therefore, the level of a given sound in phon is the dB (decibel or log scale) SPL (sound pressure level) of a sound at a frequency of 1 kHz that sounds just as loud as the given sound. A level of 0 phon has been adopted by convention to represent the limit of human perception.

It will be appreciated that the equal loudness function can be represented by discrete contours at 20 phon intervals as shown in FIG. 1, or by a larger number of more closely-spaced contours, or by an approximation by a continuous function in three-dimensional space. In the case of a set of discrete contours, outputs relating to intermediate phon values can be obtained by interpolation between contours. Therefore, this provides an example of the response data comprising a set of frequency responses, one for each of a set of discrete audio levels, and an example of a process of interpolating a frequency response from one or more of the set of frequency responses.

In the course of, for example, music mixing, it is known for mixing technicians to listen to the work in progress on high-grade and reference monitors alternatively. While high-grade monitor loudspeakers can provide accuracy, transparency and generally faithful restitution of all frequencies, reference monitors are used to evaluate how the mixed music will sound when reproduced by real-world, consumer-grade loudspeakers. In this context, it is noted that (apart from specific signal processing applied deliberately in some loudspeaker or other systems), modern audio equipment can be considered as "transparent" before the loudspeakers, which is to say that even relatively low-end equipment can reproduce and amplify audio signals with a generally flat frequency response; it is at the stage of mechanical reproduction by audio transducers that significant differences in spectral response can be introduced.

The present embodiment recognises the empirical features that monitor grade and monitoring level (audio reproduction level) can have a similar effect on the spectrum perceived by the listener. For instance, lowering the audio reproduction level while using high-end loudspeakers and switching to lower grade monitors such as reference monitors may modify the perceived frequency response in a comparable manner.

A factor behind this phenomenon lies in the fact that smaller monitors generally provide less bass frequencies than larger, higher-grade monitors. The human ear's capability to transmit bass frequencies decreases along with audio reproduction level quicker than it does with other frequencies. As discussed below, the ear's relative loss of low frequency perception that goes along with level decrease is similar to the relative loss of bass frequencies that results from the use of smaller monitors. More generally, the frequency response variations corresponding to the switch between different grades of monitors are roughly comparable to the perceived frequency response variations corresponding to audio reproduction level changes. As a result, audio reproduction level and monitor grade can be merged into a single axis, which would range from low-level playback on control monitors to high-level playback on high-grade monitors. On a practical note, the present disclosure suggests that home-studio owners with only one pair of monitors may in principle simulate other monitors of a different grade by simply using the monitoring level (audio reproduction level) knob.

The discussion above has shown that the difference of frequency response stemming from the variation of loudspeaker quality can be similar to the difference of frequency response stemming from different sound pressure levels. In other words, lowering the quality of loudspeakers modifies the frequency response the same way lowering audio reproduction levels does.

As discussed above, main monitors are high-quality loudspeakers that can be considered as audibly transparent. When content is played back at a loudness of 40 phon on main monitors, the resulting weighting performed by the ear corresponds to a 40-phon ELC. But when the same content is played on midfield monitors (medium quality loudspeakers), then the spectral contribution of the monitors relative to that of the main monitors corresponds to the difference in ELC representing a reduction of 30 phon. The combined weighting resulting from the monitors and the ear is therefore 40−30=10 phon.

The spectral performance of the midfield monitors for a loudness of 40 phon can therefore be simulated by:
(a) spectral modification or weighting of the audio signal in dependence upon a difference between the 40 phon and the 10 phon ELC; and
(b) reproduction at a level of 10 phon by the main monitor loudspeakers When the same content is played on control monitors (low-quality loudspeakers, having a spectral effect equivalent to a change in ELC of −50 phon as discussed above), then the combined weighting resulting from the monitors and the ear is 40−50=minus 10 phon, a negative loudness value. ELCs for negative loudness values can not be physically measured.

Figure 9:
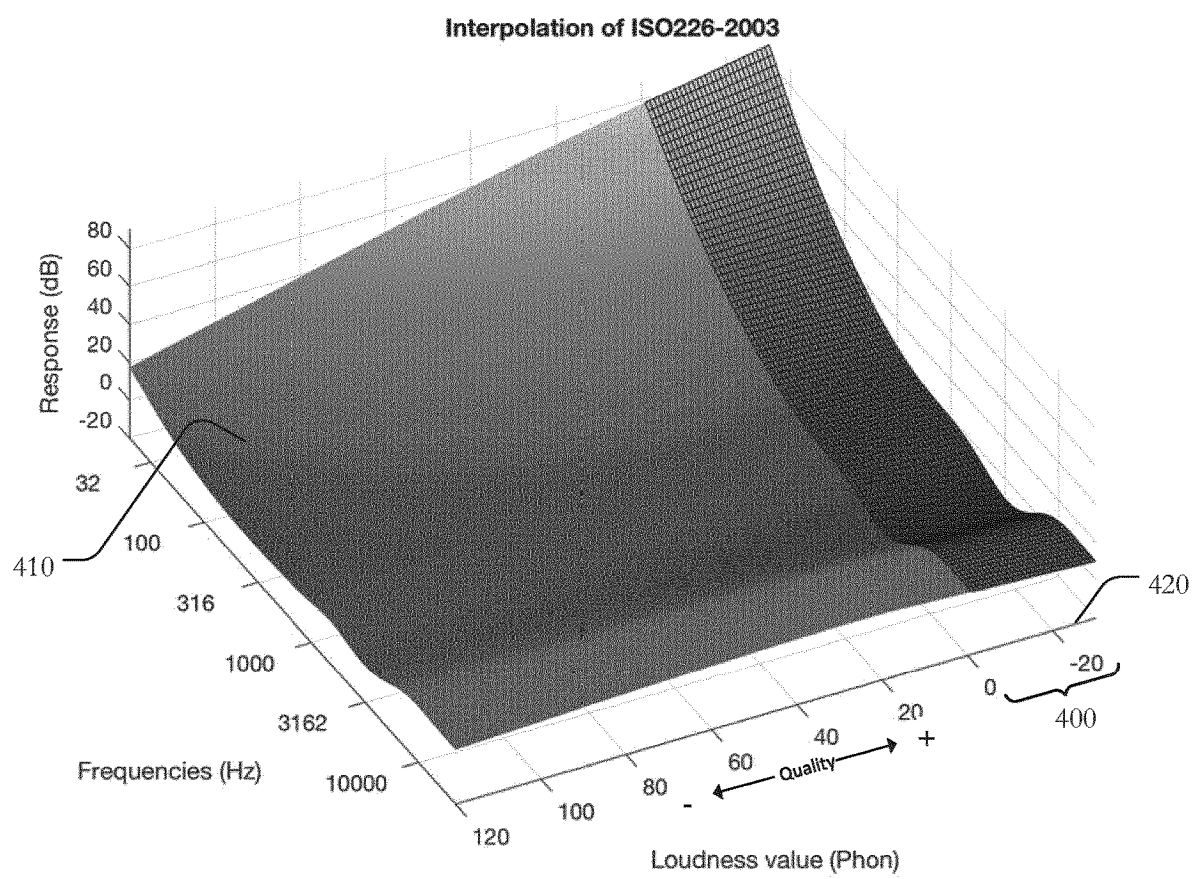
FIG. 9 schematically represents ELC data including for notional negative loudness values.

However, negative loudness ELCs can be projected or extrapolated from the behaviour of positive loudness ELCs. ELC data for each frequency is isolated. Shape-preserving piecewise cubic interpolation (used as a technique in the sense of extrapolation of data points) is applied to each frequency-specific curve as to project data corresponding to negative loudness values. The result on ISO226-2003 ELCs is illustrated by continuous or closely sampled values in FIG. 9, where a shaded portion 400 represents an extrapolation of the physically measurable (above-zero level) portion 410. FIG. 4 therefore provides an example of a set 400, 410 of equal loudness response data defining a dependency between sound pressure level and frequency, resulting in sounds of equal loudness, including for sounds of a notional negative loudness. The positive equal loudness data may be, for example, equal loudness response data defined by ISO 226:2003. Note that embodiments of the disclosure are not necessarily limited to the use of ISO226-2003 ELCs. A corresponding process can be applied to other ELC sets such as (for example) so-called Fletcher-Munson or so-called Robinson-Dadson data sets.

Therefore, it has been shown that monitor grade and audio reproduction level can have a similar effect on the spectrum perceived by the listener. For instance, lowering the audio reproduction level while using high-end loudspeakers and switching to lower grade monitors such as reference monitors may modify the perceived frequency response in a comparable manner.

More generally, it has been found that the frequency response variations corresponding to the switch between different grades of monitors are roughly comparable to the perceived frequency response variations corresponding to audio reproduction level changes. As a result, audio reproduction level and monitor grade can be considered schematically as being capable of being merged into a single axis 420 (FIG. 9), which would range from low-level playback on control monitors to high-level playback on high-grade monitors. The annotation "-<-Quality->+" on the axis 420 refers to the concept of "using these ELCs simulates a better quality or grade".

The existence of this notional single axis can be beneficial on many grounds. In particular, it can be beneficial to the field of automatic mixing as described in the embodiments above. In particular, having available negative loudness value ELCs as generated according to the description above, the target monitoring loudness according to the embodiment of FIG. 2 (reference sign 20) can be defined as a negative loudness value and the process of FIG. 2 will result in a respective negative loudness value ELC (reference sign 21 in FIG. 2). This negative loudness value ELC can be used as input for the process of automatically equalizing an input audio file to produce a processed audio filed described in FIG. 3 and the above description.

Implementation

In the following, an embodiment of an electronic device 930 is described under reference of FIG. 10. The electronic device, here a computer 930, can be implemented such that it can basically function as any type of audio processing apparatus or audio processing entity described herein.

The computer has components 931 to 940, which can form a circuitry, such as any one of the circuitries of an audio processing device.

Embodiments which use software, firmware, programs, plugins or the like for performing the processes as described herein can be installed on computer 930, which is then configured to be suitable for the embodiment.

The computer 930 has a CPU 931 (Central Processing Unit), which can execute various types of procedures and methods as described herein, for example, in accordance with programs stored in a read-only memory (ROM) 932, stored in a storage 937 and loaded into a random access memory (RAM) 933, stored on a medium 940, which can be inserted in a respective drive 939, etc.

The CPU 931, the ROM 932 and the RAM 933 are connected with a bus 941, which in turn is connected to an input/output interface 934. The number of CPUs, memories and storages is only exemplary, and the skilled person will appreciate that the computer 930 can be adapted and configured accordingly for meeting specific requirements which arise when it functions as a base station, and user equipment.

At the input/output interface 934, several components are connected: an input 935, an output 936, the storage 837, a communication interface 938 and the drive 939, into which a medium 940 (compact disc, digital video disc, compact flash memory, or the like) can be inserted.

The input 935 can be a pointer device (mouse, graphic table, or the like), a keyboard, a microphone, a camera, a touchscreen, etc.

The output 936 can have a display (liquid crystal display, cathode ray tube display, light emittance diode display, etc.), loudspeakers, etc.

The storage 937 can have a hard disk, a solid state drive and the like.

The communication interface 938 can be adapted to communicate, for example, via a local area network (LAN), wireless local area network (WLAN), mobile telecommunications system (GSM, UMTS, LTE, etc.), Bluetooth, infrared, etc.

It should be noted that the description above only pertains to an example configuration of computer 930. Alternative configurations may be implemented with additional or other sensors, storage devices, interfaces or the like. For example, the communication interface 938 may support other radio access technologies than the mentioned WLAN, GSM, UMTS and LTE.

The methods as described herein are also implemented in some embodiments as a computer program causing a computer and/or a processor and/or a circuitry to perform the method, when being carried out on the computer and/or processor and/or circuitry. In some embodiments, also a non-transitory computer-readable recording medium is provided that stores therein a computer program product, which, when executed by a processor/circuitry, such as the processor/circuitry described above, causes the methods described herein to be performed.

It should be recognized that the embodiments describe methods with an exemplary ordering of method steps. The specific ordering of method steps is, however, given for illustrative purposes only and should not be construed as binding. For example, in the process of FIG. 3, first the source audio file 31 is windowed at 301, resulting into a sequence of windows 51 containing audio, and then each window is weighted at 303 using the equal-loudness-level contour. The skilled person will readily appreciate that the order of these steps can be reversed. That is, in an alternative embodiment the source audio file 31 is first is weighted using the equal-loudness-level contour and then the resulting weighted source audio file is windowed.

Figure 10:
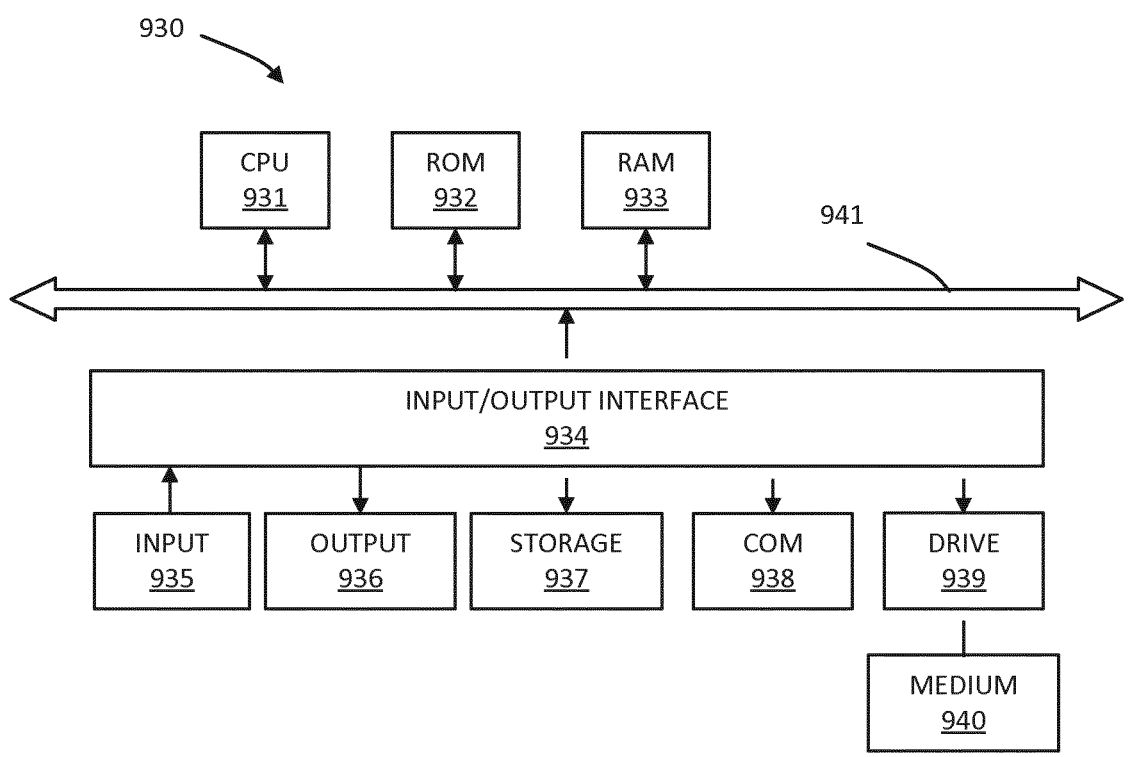
FIG. 10 schematically describes an embodiment of an electronic device for implementing the processes.

It should also be noted that the division of the control or circuitry of FIG. 10 into units 931 to 940 is only made for illustration purposes and that the present disclosure is not limited to any specific division of functions in specific units. For instance, at least parts of the circuitry could be implemented by a respective programmed processor, field programmable gate array (FPGA), dedicated circuits, and the like.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below:

(1) A method comprising determining (303) feature values (35) of an input audio window (32) and determining (304) model parameters (37) for the input audio window (32) based on processing of feature values (35) using a neural network (36).

(2) The method of (1), comprising matching (302) the spectrum of the audio window (32) to a model based on the model parameters (37).

(3) The method of (1) or (2), comprising determining (502) a target spectrum (52) for the input audio window (32) based on the model parameters (54).

(4) The method of (2) or (3), wherein matching (302) the spectrum of the audio window (32) to the model comprises determining (501) a power spectrum (51) from the audio window (32) and subtracting (602) the power spectrum (51) from the target spectrum (52) to obtain gain values (65).

(5) The method of anyone of (1) to (4), in which the model parameters are automatically set to an ideal value for a given loudness.

(6) The method of anyone of (1) to (5), further comprising determining a weighted spectrum (43) from the input audio window (32), determining (501) a power spectrum (51) from the weighted spectrum (32) and subtracting (602) the power spectrum (51) from the target spectrum (52) to obtain gain values (65).

(7) The method of (6), wherein determining a weighted spectrum (43) from the input audio window (32) comprises weighting the input audio window (32) with an equal-loudness-level contour (21).

(8) The method of (7), further comprising selecting the equal-loudness-level contour (21) based on a target monitoring loudness (20).

(9) The method of (7) or (8), wherein weighting the input audio window (32) with an equal-loudness-level contour (21) comprises transforming (401) the input audio window (32) to the spectral domain and multiplying the obtained spectrum with a processed equal-loudness-level contour (42).

(10) The method of anyone of (1) to (9), wherein the features (35) comprise values of the power spectrum (51) of the input audio window (32).

(11) The method of anyone of (1) to (10), wherein the features (35) comprise a spectral peak salience or spectral formant salience of the input audio window (32).

(12) The method of anyone of (1) to (11), wherein the features (35) comprise the spectral flatness or Wiener entropy of the power spectrum (51) of the input audio window (32).

(13) The method of anyone of (1) to (12), wherein the neural network (36) is trained in advance with a collection of input audio windows by manually setting, for each window, the formant attenuation coefficient so that the processed audio window appears the best sounding possible.

(14) The method of (7), wherein the equal loudness-level contour (21) is a negative loudness ELC.

(15) The method of (8), wherein the target monitoring loudness (20) is a negative loudness.

(16) An electronic device comprising circuitry configured to perform the method of anyone of (1) to (5).

(17) A computer program comprising instructions, which when executed on a processor cause the processor to perform the method of anyone of (1) to (16).

(18) A machine readable medium comprising instructions, which when executed on a processor cause the processor to perform the method of anyone of (1) to (16).

REFERENCES

[IS0226-2003] International Standard ISO 226, Second edition, 15. August 2003, "Acoustics—Normal equal-loudness-level"

[Lartillot 2014] Olivier Lartillot, "MIRtoolbox 1.6.1 User's Manual", Aalborg University, Denmark, Department of Architecture, Design and Media Technology, Dec. 7, 2014

The invention claimed is:

1. A method comprising:
   determining feature values of an input audio window;
   determining model parameters for the input audio window based on processing of feature values using a neural network;
   determining a weighted spectrum from the input audio window;
   determining a power spectrum from the weighted spectrum; and
   subtracting the power spectrum from a target spectrum to obtain gain values.

2. The method of claim 1, comprising:
   matching a spectrum of the audio window to a model based on the model parameters.

3. The method of claim 1, comprising:
   determining the target spectrum for the input audio window based on the model parameters.

4. The method of claim 1, wherein
   the model parameters are automatically set to an ideal value for a given loudness.

5. The method of claim 1, wherein
   determining the weighted spectrum from the input audio window comprises weighting the input audio window with an equal-loudness-level contour.

6. The method of claim 5, further comprising:
   selecting the equal-loudness-level contour based on a target monitoring loudness.

7. The method of claim 5, wherein
   weighting the input audio window with the equal-loudness-level contour comprises transforming the input audio window to the spectral domain and multiplying the obtained spectrum with a processed equal-loudness-level contour.

8. The method of claim 1, wherein
   the feature values comprise values of the power spectrum of the input audio window.

9. The method of claim 1, wherein
   the feature values comprise a spectral peak salience or spectral formant salience of the input audio window.

10. The method of claim 1, wherein
    the feature values comprise a spectral flatness or Wiener entropy of a power spectrum of the input audio window.

11. The method of claim 1, wherein
    the neural network is trained in advance with a collection of input audio windows by manually setting a formant attenuation coefficient for each window.

12. The method of claim 5, wherein
    the equal loudness-level contour is a negative loudness equal loudness-level contour.

13. The method of claim 6, wherein
    the target monitoring loudness is a negative loudness.

14. An electronic device comprising circuitry configured to:
- determine feature values of an input audio window;
- determine model parameters for the input audio window based on processing of feature values using a neural network;
- determine a weighted spectrum from the input audio window;
- determine a power spectrum from the weighted spectrum; and
- subtract the power spectrum from a target spectrum to obtain gain values.

15. A method comprising:
- determining feature values of an input audio window; and
- determining model parameters for the input audio window based on processing of feature values using a neural network; and
- matching a spectrum of the audio window to a model based on the model parameters, wherein the matching includes
  - determining a weighted spectrum from the input audio window;
  - determining a power spectrum from the weighted spectrum; and
  - subtracting the power spectrum from a target spectrum to obtain gain values.

* * * * *